US008661653B2

(12) United States Patent
Thomsen, III et al.

(10) Patent No.: US 8,661,653 B2
(45) Date of Patent: Mar. 4, 2014

(54) METHODS OF MAKING Z-SHIELDING

(75) Inventors: Donald Laurence Thomsen, III, Yorktown, VA (US); Roberto J. Cano, Yorktown, VA (US); Brian J Jensen, Williamsburg, VA (US); Stephen J Hales, Newport News, VA (US); Joel A Alexa, Hampton, VA (US)

(73) Assignee: United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 13/191,882

(22) Filed: Jul. 27, 2011

(65) Prior Publication Data
US 2012/0023737 A1 Feb. 2, 2012

Related U.S. Application Data

(60) Provisional application No. 61/368,361, filed on Jul. 28, 2010.

(51) Int. Cl.
*H01F 7/06* (2006.01)
(52) U.S. Cl.
USPC ........... 29/602.1; 29/592.1; 29/885; 174/394; 204/192.15; 250/515.1; 442/64; 442/65; 442/131; 427/404; 427/447; 427/455; 427/456
(58) Field of Classification Search
USPC ...................... 29/592.1, 602.1, 885; 174/394; 204/192.15; 250/515.1; 442/131, 64, 442/65; 427/404, 448, 455, 456; 205/183
See application file for complete search history.

(56) References Cited

U.S. PATENT DOCUMENTS

| 4,938,233 | A | | 7/1990 | Orrison, Jr. | |
|---|---|---|---|---|---|
| 5,483,100 | A | * | 1/1996 | Marrs et al. | 257/700 |
| 5,891,528 | A | * | 4/1999 | Turek et al. | 427/448 |
| 6,048,379 | A | | 4/2000 | Bray et al. | |
| 6,281,515 | B1 | | 8/2001 | DeMeo et al. | |
| 6,459,091 | B1 | | 10/2002 | DeMeo et al. | |
| 6,583,432 | B2 | | 6/2003 | Featherby et al. | |
| 6,674,087 | B2 | | 1/2004 | Cadwalader et al. | |
| 6,828,578 | B2 | | 12/2004 | DeMeo et al. | |
| 6,841,791 | B2 | | 1/2005 | DeMeo et al. | |
| 6,893,596 | B2 | * | 5/2005 | Haas et al. | 264/257 |
| 7,148,084 | B2 | | 12/2006 | Strobel et al. | |
| 7,196,023 | B2 | | 3/2007 | Langley et al. | |
| 7,274,031 | B2 | | 9/2007 | Smith | |
| 7,476,889 | B2 | | 1/2009 | DeMeo et al. | |
| 7,595,112 | B1 | | 9/2009 | Cano et al. | |
| 7,718,984 | B2 | | 5/2010 | Edwards et al. | |
| 7,851,062 | B2 | | 12/2010 | Hales et al. | |
| 2008/0249753 | A1 | | 10/2008 | Wilson et al. | |

* cited by examiner

*Primary Examiner* — Paul D Kim
(74) *Attorney, Agent, or Firm* — Jennifer L. Riley; Thomas K. McBride, Jr.

(57) ABSTRACT

Methods of building Z-graded radiation shielding and covers. In one aspect, the method includes: providing a substrate surface having about medium Z-grade; plasma spraying a first metal having higher Z-grade than the substrate surface; and infusing a polymer layer to form a laminate. In another aspect, the method includes electro/electroless plating a first metal having higher Z-grade than the substrate surface. In other aspects, the methods include improving an existing electronics enclosure to build a Z-graded radiation shield by applying a temperature controller to at least part of the enclosure and affixing at least one layer of a first metal having higher Z-grade from the enclosure.

11 Claims, No Drawings

METHODS OF MAKING Z-SHIELDING

CROSS-REFERENCE TO RELATED APPLICATIONS

This patent application claims the benefit of U.S. Provisional Patent Application No. 61/368,361, filed Jul. 28, 2010. This patent application also is related to U.S. Provisional Patent Application Nos. 61/359,955 and 61/359,961, filed Jun. 30, 2010.

STATEMENT REGARDING FEDERALLY SPONSORED RESEARCH AND DEVELOPMENT

This invention was made in part with Government support under Contract Numbers NN07AA008 and NNL07AM071 awarded by the National Aeronautics and Space Administration. The Government may have certain rights in this invention.

BACKGROUND OF THE INVENTION

Current methods of radiation shielding incorporate thick single layer sheet metal using typically one metal or two metals with different atomic numbers (Z) in separate sheets. Such radiation shielding is needed for various purposes such as for nuclear reactors or piping for radioactive fluids. Such shielding is also needed for protective clothing for nuclear hazardous waste handlers. Such shielding is also needed for various spacecraft, extra-vehicular-activity (EVA) suits, and instrumentation tools or electronics enclosures. Accordingly, a continuing need exists for improved methods of making shielding tailored to reduced thicknesses, weights, and/or specific applications.

BRIEF SUMMARY OF THE INVENTION

In view of the foregoing, it is an object of the invention to provide a method for manufacturing Z-graded radiation shielding with tailored weights for specific applications.

It is a related object of the invention to provide the ability to manufacture Z-graded laminates for shielding covers or structures, or to improve existing electronics enclosures with additional Z-graded materials.

These objects are achieved by the present invention, which provides methods of building Z-graded radiation shielding and covers. In at least one embodiment, methods of building a Z-graded laminate are provided that include the steps of providing a substrate surface having about medium Z-grade; plasma spraying a first metal having higher Z-grade than the substrate surface; and infusing a polymer layer to form a laminate. In other embodiments, the methods include providing a substrate surface having about medium Z-grade; electro/electroless plating a first metal having higher Z-grade than the substrate surface; and infusing a polymer layer to form a laminate.

In yet other embodiments, the invention provides methods of improving an existing electronics enclosure to build a Z-graded radiation shield having the steps of providing an existing electronics enclosure; applying a temperature controller to at least part of the enclosure; and affixing at least one layer of a first metal having higher Z-grade than the enclosure.

Additional objects, embodiments and details of this invention can be obtained from the following detailed description of the invention.

DETAILED DESCRIPTION OF THE INVENTION

Typical radiation shielding has been made by increasing the thickness of aluminum enclosures to meet radiation reduction requirements. For example, methods and programs for engineering design processes for shields controlling radiation doses to targets of interest have been disclosed in, inter alia, U.S. Patent Application Publication No. 2008/0249753 A1, which is entirely herein incorporated by reference thereto. Z-grading is a method of improving radiation shielding by using metal layers with varying densities or layers of other materials. Radiation shielding has been traditionally done by increasing aluminum sheet thickness for enclosures to protect electronics. It has been shown that varying metal densities with different sheets can increase shielding effectiveness. However, such shielding is typically parasitic, where it increases the weight of the enclosure with only marginal structural contribution.

The use of fabrics in Z-shielding increases the incorporation of flexible materials and laminate materials into radiation shielding applications. For instance, the use of fabrics permits spot shields and cable shields in areas where shielding can improve instrumentation performance and data transfer. The use of fabrics also permits custom molding and is amenable to having metal(s) affixed using known methods, including plasma spray deposition and/or electro/electroless plating. In some advantageous embodiments, metals may be layered onto other metals as well.

In at least one embodiment, a high density metal. such as tungsten or tantalum, or other a high density alloy (like copper—tungsten), is plasma spray coated to fabric, such as carbon fiber or glass fiber. Then a lower density metal, such as copper, is plasma spray coated to fiber. Then a lower density metal, such as titanium or aluminum, can be added to fiber. Then composite fiber without metal can be added for the lowest Z-grade layer. These varying density fiber layers can be shaped and then molded into appropriate geometry with polymeric resin, such as epoxy, cyanoester, or polyimide, in order to make a laminate. These fabrics may optionally only be partially infused with polymer or else they may be fully laminated into a stiff laminate. They can alternatively be stacked and bent or flexed into a shape and attached to a place needing shielding with varying amounts of polymer as needed.

Direct deposition of tantalum, a refractory metal, onto carbon fiber fabric using radio frequency (RF) plasma spraying has enabled the development of hybrid metal laminates for reducing high energy electron radiation. Tantalum bulk values and thin film values have been reported in the literature as 16.6 and 15.6 g/cm$^3$ respectively. See, e.g. Maissel and Glang. Handbook of Thin Film Technology, McGraw Hill Publishing, 1970. Tantalum RF plasma spray foil showed a density of 16.02+/−0.02 g/cm3, volume resistivity 49+/−6 µohms-cm, and body-centered cubic (bcc) crystal structure. These values are representative of a dense tantalum coating, important for radiation shielding of energetic electrons. The coating process also enables the capability to build functionally graded layers with varying atomic number (Z). The incorporation of tantalum coatings (Z=73) with carbon fiber (Z=6) produces a Z gradient from high to low. Other metals which have also been successfully RF plasma spray coated on to the carbon fiber fabric include titanium (Z=22) and copper (Z=29). The incorporation of high Z and low Z materials increases radiation shielding performance as a result of the inherently different stopping powers of each Z material at the atomic level and collisional/radiative losses at the nuclear level. The ability to coat carbon fiber fabric with Z-layers permits processing of radiation shielding with new techniques such as vacuum assisted resin transfer molding (VARTM) in comparison to traditional sheet metal methods. These fabrics and resulting consolidated structural composite laminates demonstrate utility in non-traditional shielding arrangements, designs, and/or multifunctional structures. In addition, direct tantalum coating of existing aluminum materials augments radiation shielding to existing space technologies. Relevant radiation environments include geostationary earth orbit (GEO) and outer planetary trajectories where high energy electrons dominate. Analytical modeling of the GEO electron radiation environment show gains in radiation shielding when more than one Z material is layered together. Metal fiber laminates can increase the radiation shielding effectiveness as a function of weight with a broad range of applications based on composite manufacturing processes.

The incorporation of high Z metal with low Z carbon fiber composites into a simple Z-grade builds a tailored radiation shield for high energy electron radiation. Lower Z metals such as Al, Ti, and Cu have also been sprayed. In some embodiments, preferred features of the new materials made by the invention are that layers of RF Plasma sprayed metals can be manufactured on top of each other. Typical Z-layering approaches require the use of metal rod or sheet that must be cut and machined. If more than one metal is used on top of each other, the materials must be attached by screws or adhesive with individual layers grounded. Varying thicknesses between sheet layers is difficult because the metal form does not allow conformability to the surface. The plasma spray approach, preferably using RF techniques, allows the ability via the spraying process to vary thickness selectively of each layer based on the positioning in the plasma spray. This coating approach, by increasing shielding in one area and reducing it in other areas, changes the way shields can be designed and manufactured. The hybrid nature of high Z metal with carbon fiber laminates offer a game changing opportunity to increase radiation shielding performance, instrument capability and mission assurance for Space Science and Exploration missions. Radiation is the highest risk to mission assurance for long duration interplanetary and some of planetary missions for spacecraft and instruments. The use of structurally efficient radiation shielding reduces this risk.

Whether metal is affixed to a substrate using plasma spraying or by electro/electroless plating, the subsequent metal surface may be optionally polished, finished, sanded, or otherwise treated to obtain desired thickness, uniformity, and smoothness. One desirable feature of plasma spraying involves the porous, or semi-permeable nature, of the resulting material, which synergistically allows infusion of polymer through laminating processes as known to those of skill in the art.

Plasma spraying and/or electro/electroless plating of metal layers also provides the advantage of allowing the ability to pattern or vary the thickness of different Z-graded layers, as opposed to Z-grade sheets of metal which typically only come in fixed thicknesses and uniform size. Such pattern printing may be done through physical masking during the spray process, or by post processing treatments, such as, e.g. etching, scoring, or cracking the material. In some instances, it may be beneficial to embed functional patterns such as for thermal heat pipes, radiative/conductive/and/or convective cooling piping, channels or other integrated functionality, such as would permit piping or channels to be embedded in the shielding to allow circulation of heating or cooling fluids or other thermal conductors as are known to those of skill in the art. Also, with thermal protection in mind, the shielding made by methods of the invention can also be used as thermal shielding to avoid high temperature or low temperature excursions with or without embedded radiator-like cooling sub-piping or channels. For example, and without limitation, it is believed that tantalum and/or rhenium would make excellent thermal shielding material that would provide excellent benefits when made by the Z-graded methods of the instant invention.

Accordingly, in at least some embodiments, the instant inventive methods include where the shielding cover and structure is selected from the group consisting of slabs, vaults, spot enclosures, thermal barriers, and PCI card chassis structures. In some preferred embodiments, the plasma spraying step comprises depositing metal by low-pressure radio frequency plasma spray technique, such as disclosed and described in U.S. Pat. No. 7,851,062 and references cited therein. The substrate surface can comprise metal, glass or graphite fibers or their equivalents as known to those skilled in the art. As mentioned above, the metals can comprise a compound selected from the group consisting of tantalum, copper, tungsten, titanium, aluminum, and alloys or combinations thereof The polymer or resin preferable comprises a compound selected from the group consisting of epoxy, polyimide, cyanoacrylate, and mixtures thereof. In some electronic shielding applications, the polymer preferably comprises a conductive filler to provide increased electromagnetic-interference resistance. And as also mentioned above, when a second metal is applied to the shield, it may be applied over the first metal whereby one or the other metal is used as a thermal heat pipe that can be integrated into the shield without expensive post finishing, the use of extra conductive epoxies to bond the insert, and/or other difficult and expensive post-treatment steps necessary to prepare a thermal heat pipe inside a Z-graded shield material.

Moreover, and without wishing to be bound by any one theory, use, or application; it is believed that beneficial uses for shielding made by methods of the invention include shields for nuclear reactors or piping for radioactive fluids, protective clothing for nuclear hazardous waste handlers or astronauts, and spacecraft instrumentation or electronic enclosures. Shielding may be applicable to electron or gamma ray applications. Spacecraft applications range from primary shielding of electronics and instrument sensors to secondary shielding applications for instruments with specific additional radiation shielding requirements. The radiation shielding of transients in CCD arrays is a systemic challenge, where improved shielding methods have significant payoff in camera resolution and contrast. The combination of high and low Z materials can be used in layers to take advantage of the different stopping powers of the materials to increase shielding efficiency as a function of weight. Accordingly, in some aspects of the invention at least, the technology is flexible, moldable, and can be made for custom, hard-to-shield locations; it has less weight than traditional radiation shielding material; the shield can be integrated with resins to provide easy adhesion and a conformal shape; and such flexible shielding material can be of particular utility in end cap components.

The following examples further illustrate the invention but, of course, should not be construed as in any way limiting its scope.

EXAMPLES

Various samples were prepared in accord with the methods of the invention.

The Ta Rf Plasma Spray foil was determined to be 16.02 g/cm3. The laminate thicknesses were approximated to be 10 mils formed during the lamination process. The Ta/Cyanate composite film thickness were Ta 14 mils/30 mils cyanate composite, Ta 15 mils/20 mils cyanate composite, 16 mils Ta/10 mils cyanate composite, also 10 mils Ta/70 mils cyanate composite. These ratios were compared with aluminum, tantalum, Ta/Al, and cyanate composite. A cyanate ester liquid resin, such as EX1510 by TenCate can be used to infuse the layered materials per the VARTM process and cured as known to the art, including such methods as described in U.S. Pat. Nos. 7,595,112 and 7,851,062, which are incorporated herein by reference thereto.

The trend for the electron shielding effectiveness for the samples were: Ta/Al, Ta, Ta/cyanate composite, Al, and cyanate composite.

Aluminum performed best for proton shielding effectiveness: aluminum, cyanate composite, Ta, Ta/cyanate composites.

It was apparent the use of Ta with the cyanate composite contributes to a large increase in mechanical properties as shown in Table 1.

TABLE 1

Modulus and Strength Comparison.

| Materials | Z-Number | Density g/cm$^3$ | Modulus | Strength | Reference |
|---|---|---|---|---|---|
| Tantalum | 73 | 16.6 | 186 GPa | 650 MPa | www.eaglealloys.com |
| Aluminum | 13 | 2.79 | 68.9 GPa | 310 MPa | asm.matweb.com |
| Cyanate M55J | 6 | 1.60 | 324 GPa | 2303 MPa | Hexply 954-3 |

Table 2 shows that a 15 mil Ta/20 mil cyanate composite had the highest stiffness of the shielding materials. The greater amount of cyanate composite will increase stiffness, but reduce electron radiation shielding. It was apparent there was a large gain in thickness reduction and stiffness increase with a Ta/cyanate composite.

TABLE 2

Stiffness Comparison of 0.686 g/cm$^2$ materials

| Materials | Thickness cm (mil) | Stiffness |
|---|---|---|
| Ta | 0.0630 (16) | 117 MN/m |
| Al | 0.254 (100) | 175 MN/m |
| Cyanate Composite | 0.429 (169) | 1.39 GN/m |
| Ta/Cyanate Composite | (15/20) | 110 + 164 = 274 MN/m |

In another example, a Space 104 conduction cooled aluminum stackable enclosure for space avionics based on the PCI-104 form factor was used for a Z-shielding demonstration. Z-shielding was affixedonlto 100 mil Space 104 electronic aluminum endcaps by using high density tantalum on the endcap top surface, and casting low density engineering polymer coating underneath the endcap. This high-Z, low-Z grading using the endcaps was modeled for radiation performance and shows a reduction of radiation exposure to approximately 5500 rad/day silicon (ref 105 day Europa mission fluence spectra).

It should be noted, that as far as Z-grading metal on other metal materials, precautions may be required in some instances to avoid melting too much or damaging the underlying metal or fabric when adding a high melting metal on top of a lower melting metal layer. Such precautions include monitoring or controlling temperature, which may be done in preferred embodiments by using cold-finger temperature controllers to remove excess heat as known to those of skill in the art.

All references, including publications, patent applications, and patents, cited herein are hereby incorporated by reference to the same extent as if each reference were individually and specifically indicated to he incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of building a Z-graded laminate for the production of radiation shielding covers or structures comprising:
    (a) providing a substrate surface having a Z-grade;
    (b) forming a layered material by plasma spraying a first metal onto the substrate surface, wherein the first metal has a higher Z-grade than the substrate surface; and
    (c) infusing a polymer layer into the layered material to form the Z-graded laminate.

2. The method of claim 1, wherein the radiation shielding cover or structure is selected from the group consisting of slabs, thermal barriers, vaults, spot enclosures, and PCI card chassis structures.

3. The method of claim 1, wherein the plasma spraying step comprises depositing the first metal by low-pressure radio frequency plasma spray technique.

4. The method of claim 1, wherein the substrate surface comprises metal, glass or graphite fibers.

5. The method of claim 4, wherein the substrate surface comprises glass or graphite fibers.

6. The method of claim 1, wherein the first metal comprises a compound selected from the group consisting of tantalum, copper, tungsten, titanium, aluminum, rhenium, and alloys or combinations thereof.

7. The method of claim 1, further comprising the step of plasma spraying a second metal having a higher Z-grade than the substrate surface.

8. The method of claim 7, wherein the second metal is different from the first metal, and comprises a compound selected from the group consisting of tantalum, copper, tungsten, titanium, aluminum, rhenium, and alloys or combinations thereof.

9. The method of claim 7, wherein the first metal is patterned in a shape of a thermal heat pipe.

10. The method of claim 1, wherein the polymer layer comprises a compound selected from the group consisting of epoxy, polyimide, cyanoacrylate, and mixtures thereof.

11. The method of claim 1, wherein the step of infusing is conducted using vacuum assisted resin transfer molding and curing.

* * * * *